United States Patent [19]

Reimer

[11] Patent Number: 4,531,175
[45] Date of Patent: Jul. 23, 1985

[54] PRINTED WIRING BOARD GUIDE

[75] Inventor: William A. Reimer, Wheaton, Ill.

[73] Assignee: GTE Communication Systems Corporation, Northlake, Ill.

[21] Appl. No.: 622,529

[22] Filed: Jun. 20, 1984

[51] Int. Cl.³ .............................................. H05K 7/18
[52] U.S. Cl. .................................. 361/399; 361/415; 361/429; 211/41; 211/181; 220/19
[58] Field of Search ............... 361/427, 417, 420, 395, 361/412, 331, 429, 419, 397, 399, 415, 380; 211/41, 181; 220/19; 206/328, 330

[56] References Cited

U.S. PATENT DOCUMENTS

| | | | |
|---|---|---|---|
| 3,176,849 | 4/1965 | Peebles | 211/181 |
| 3,669,393 | 10/1972 | Reimer | 361/415 |
| 3,716,760 | 2/1973 | Bertellotti | 361/415 |
| 3,863,113 | 1/1975 | Ward | 361/415 |
| 3,918,588 | 11/1975 | Walser | 211/181 |
| 4,150,629 | 4/1979 | Santi | 211/41 |
| 4,229,778 | 10/1980 | Williams | 361/399 |
| 4,434,899 | 3/1984 | Rivkin | 361/415 |

Primary Examiner—G. P. Tolin
Attorney, Agent, or Firm—Robert J. Black; Gregory G. Hendricks

[57] ABSTRACT

A guide for use with a vertically oriented printed wiring board supported on a pair of support beams. The guide is of wire construction including guide fingers alternately formed on both sides of the printed wiring board. Attachment members are formed at either end of the guide and optionally may be formed at one or more locations intermediate the ends. The end positioned attachment members are connected to the support beams and the intermediate attachment members may be connected to an associated aligner rod to maintain the guide in a predetermined alignment.

5 Claims, 1 Drawing Figure

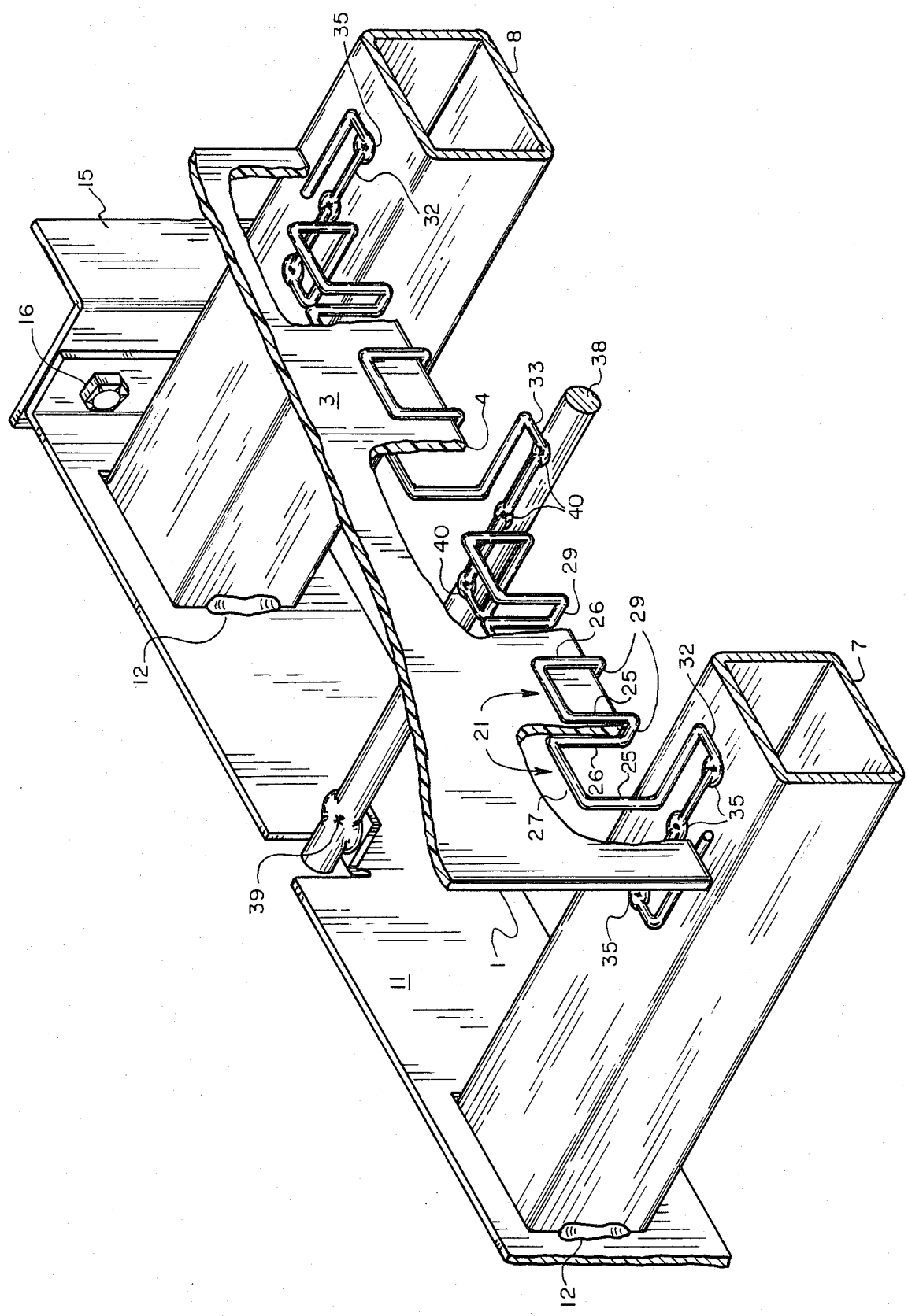

PRINTED WIRING BOARD GUIDE

The present invention relates to printed wiring board guides and, more particularly, to a printed wiring board guide of wire construction for use in guiding a printed wiring board where the board support is basically provided by support beams.

Printed wiring board guides are very well known to those skilled in the art. One very common type is described in U.S. Pat. No. 3,716,760 issued Feb. 13, 1973, to Ansano Bertellotti, et al., and teaches a printed wiring board file including a front support formed of a rectangular tubular member having a slotted steel card guide on its top and bottom surfaces and a rear support formed of a circular tubular member having a slotted card guide at the top and bottom. The front card guide slots are so shaped as to align a wiring board horizontally with the rear card guide slots while the rear support member serves to vertically align the printed wiring board during insertion of the board into an associated connector. The tubular members are supported and positioned relative to the connector by a pair of end bracket stampings engaging the tubular members, which stampings are affixed to an upright support member mounting the connectors.

The above arrangement while operating generally satisfactorily has been found to cause difficulty when attempting to align a printed wiring board with the rear card guide slots after having inserted the printed wiring board in the front card guide slots.

Yet another printed wiring board guide known to those skilled in the art, involves pairs of straight guide rods attached to the support beams, each wire of the pair spaced apart the thickness of the printed wiring board to be guided and the pairs of guide rods spaced apart a predetermined printed wiring board spacing. Depth of engagement of the guide rods with the printed wiring board edge is achieved by selecting the rod diameter equal to twice the desired printed wiring board engagement depth.

This approach, while operating generally satisfactorily has the disadvantage that the depth of engagement of the guide rods with the printed wiring board edge is determined by the cross-section of the attached rods and, as the rod cross-section increases the weight of the guide assembly increases. Additionally, the printed wiring board guide rods of increased cross-section obstruct air flow between the printed wiring board assemblies.

SUMMARY OF THE INVENTION

The present invention overcomes the disadvantages of prior art assemblies by providing a new and improved arrangement for guiding a vertically oriented printed wiring board having a first side, a second side, and a lower edge, which board is supported on a pair of support beams engaging the lower edge, the beams are connected to a support arm which is attached to a vertical upright member of a frame. The printed wiring board guide includes a plurality of guide fingers of wire construction formed parallel to the printed wiring board side surfaces and extending in an upward direction from the lower edge, the fingers alternately positioned on the first and the second sides of the printed wiring board. A plurality of joining members are included to connect the guide fingers. A plurality of attachment members are formed in a plane perpendicular to the fingers and adjacent to the lower edge, the attachment members connected to the board guide at predetermined locations, connected to corresponding ones of the joining members, and attached to the support beams.

The attachment members may be of wire construction and the guide fingers may be of inverted U-shaped construction, each finger including a first vertical leg, a second vertical leg, and a horizontal segment connecting the legs, the second vertical leg of a guide finger on a first side of the printed wiring board opposite a first guide leg of a guide finger on a second side of the printed wriring board, the joining members connecting the corresponding opposite second and first vertical legs. The attachment members may be of S-shaped construction and may be attached to the support beams by spot welding. The guide fingers, joining members, and attachment members may be formed in a predetermined consecutive order from a single wire thereby forming a printed wiring board guide of serpentine wire construction. The printed wiring board guide may include a pair of attachment members formed at opposite ends of the printed wiring board guide and an intermediate guide formed in the guide between the two ends, the end attaching members each connected to a respective one of the support beams and the intermediate attaching member connected to an aligner rod, the aligner rod connected to the support arm to align the printed wiring board guide.

BRIEF DESCRIPTION OF THE DRAWING

The various features, advantages and benefits of a printed wiring board guide in accordance with the present invention will be apparent from the following description taken in conjunction with the accompanying single FIGURE drawing in which is shown a perspective view of a printed wiring board guide in accordance with the present invention.

DESCRIPTION OF THE PREFERRED EMBODIMENT

Referring now to the single FIGURE drawing there is shown a printed wiring board 1 including a first side 2 (not shown), opposite a second side 3 and a lower edge 4. The printed wiring board 1 is supported by a front support beam 7 and a rear support beam 8. The support beams in turn, are supported by a support arm 11 to which the support beams 7 and 8 are attached. The support beams 7 and 8 may be attached to the support arm 11 by any means well known to those skilled in the art, as for example, by the application of welds 12 joining the two members. The support arm 11 is attached for support to a frame upright 15 by means of a fastener 16.

A printed wiring board guide is shown including a plurality of guide fingers 21 formed alternately on the first side 2 and the second side 3 of the printed wiring board 1. The guide fingers 21 each include a first vertical leg 25, a second vertical leg 26, and a horizontal segment 27 connecting the legs at their upper ends. The guide fingers 21 are positioned to locate the second vertical leg 26 of a guide finger 21 located on a first side 2 of the printed wiring board 1 opposite the first vertical leg 25 of an associated guide finger 21 located on the second side 3 of the printed wiring board 1. Joining members 29 connect corresponding opposite vertical legs of the guide fingers 21. The joining members 29 may be of varying lengths to accommodate printed wiring boards of varying thicknesses and the vertical legs 25 and 26 may be of varying lengths to prevent disengagement of the printed wiring board from the guide due to board, guide, or support movement which may occur from time to time.

A pair of attachment members 32 are formed at the front end and the rear end of the printed wiring board guide. An intermediate attachment member 33 is formed in the printed wiring board guide between the end attachment members 32. The end attachment members 32 may be attached to the front and rear support beams (7 and 8) by any technique known to those skilled in the art. In this regard, the attachment members 32, shown in the FIGURE of S-shaped construction, are attached to the support beams 7 and 8 by means of spot welds 35. An aligner rod 38 is included and attached to the support arm 7 by any means known to those skilled in the art. In this regard, the aligner rod 38 is attached to the support arm 11 by means of a spot weld 39. The aligner rod 38 may be attached to the intermediate attachment member 33 by means of spot welds 40. The aligner rod serves to maintain alignment of the printed wiring board guide to a predetermined form while not providing a support function.

While welding, in the form of weld beads 12, and spot welds 35, 39 and 40, has been recited as a means for fastening the various members of the present invention together, it will be appreciated that other joining means may be equally effectively employed as for example, adhesive fastening.

The guide fingers 21 may optionally include a semicircular horizontal segment 27 or no horizontal segment at all in which case the vertical legs 25 and 26 of each guide finger 21 would slope toward each other in an upward direction and be joined at their upper ends.

It will now be apparent that a printed wiring board guide has been described hereinabove which offers significant advantages and benefits over prior art assemblies. The printed wiring board guide, by virtue of its wire construction may be fabricated to accommodate various width printed wiring boards and may be affixed to associated support beams at various boards spacings arranged to accommodate printed wiring boards of differing thicknesses. Additional benefits of the present invention are light weight construction and minimum obstruction to air flow between adjacent printed wiring boards. The aligner rod attached to the printed wiring board guide of the present invention may be advantageously used to maintain a predetermined shape of the printed wiring board guide, that shape being most commonly linear but optionally, the shape may be curved.

Although the preferred embodiment of the invention has been illustrated, and the form described in detail, it will be readily apparent to those skilled in the art that various modifications may be made therein without departing from the spirit of the invention or from the scope of the appended claims.

What is claimed is:

1. A printed wiring board guide with a vertically oriented printed wiring board wherein said board is supported on a pair of support beams engaging a lower edge of said board, the beams connected to a support arm attached to a frame including at least one vertical upright, said guide comprising:

a plurality of guide fingers of wire construction formed parallel to said printed wiring board extending in an upward direction from said lower edge, and alternately positioned on a first and a second side of said printed wiring board;

a plurality of joining members of wire construction connecting said guide fingers;

a plurality of attachment members of wire construction formed in a plane perpendicular to said fingers and adjacent to said lower edge, said attachement members connected to said joining members in said board guide, and said attachment members formed at each of a first and a second opposite end of said guide, and formed at an intermediate position in said guide between said end attachment members, said end attachment members each connected to a respective one of said support beams; and an aligner rod, said aligner rod attached to said support arm and connected to said intermediate attachment members to align while not supporting said guide.

2. A guide as claimed in claim 1, wherein: said guide fingers are of inverted U-shaped construction each including a first vertical leg, a second vertical leg, and a horizontal segment connecting said legs, said second vertical leg of said guide finger positioned on said first side of said printed wiring board opposite said first vertical leg of said guide finger positioned on said second side of said printed wiring board, said joining members connecting corresponding opposite second and first vertical legs.

3. A guide as claimed in claim 1, wherein: said attachment member is of squared S-shaped construction.

4. A guide as claimed in claim 2, wherein: said guide fingers, said joining members and said attachment members, are formed consecutively from a single wire, said consecutive form defining a guide of serpentine construction.

5. A guide as claimed in claim 1, wherein: said attachment members are connected to said support beams by spot welding.

* * * * *